(12) United States Patent
Howard et al.

(10) Patent No.: US 7,892,889 B2
(45) Date of Patent: Feb. 22, 2011

(54) ARRAY-PROCESSED STACKED SEMICONDUCTOR PACKAGES

(75) Inventors: Gregory E Howard, Dallas, TX (US); Vikas Gupta, Dallas, TX (US); Darvin R Edwards, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/491,667

(22) Filed: Jun. 25, 2009

(65) Prior Publication Data
US 2009/0305464 A1    Dec. 10, 2009

Related U.S. Application Data

(62) Division of application No. 11/460,101, filed on Jul. 26, 2006, now abandoned.

(51) Int. Cl.
H01L 21/00 (2006.01)
(52) U.S. Cl. ............... 438/109; 438/127; 257/E23.001
(58) Field of Classification Search ......... 438/107–112, 438/113, 127; 257/E23.001, E23.024, E21.499, 257/E21.502
See application file for complete search history.

(56) References Cited

U.S. PATENT DOCUMENTS

| | | | |
|---|---|---|---|
| 6,268,662 B1 * | 7/2001 | Test et al. .................. 257/784 |
| 6,815,254 B2 * | 11/2004 | Mistry et al. ................ 438/108 |
| 2005/0184377 A1 * | 8/2005 | Takeuchi et al. ............ 257/686 |
| 2007/0262436 A1 * | 11/2007 | Kweon et al. ............... 257/686 |
| 2007/0262470 A1 * | 11/2007 | Ichiryu et al. ............... 257/783 |
| 2008/0023805 A1 * | 1/2008 | Howard et al. .............. 257/666 |

* cited by examiner

Primary Examiner—Michael S Lebentritt
Assistant Examiner—Daniel Whalen
(74) Attorney, Agent, or Firm—Yingsheng Tung; Wade J. Brady, III; Frederick J. Telecky, Jr.

(57) ABSTRACT

One embodiment of the invention is a semiconductor system (1400) of arrays (1401, 1402, etc.) of packaged devices. Each array includes a sheet-like substrate (1411, 1412, etc.) made of insulating material integral with conductive horizontal lines and vertical vias, and terminals on the surfaces. Semiconductor components, which may include more than one active or passive chips, or chips of different sizes, are attached to the substrate; the electrical connections may include flip-chip, wire bond, or combination techniques. Encapsulation compound (1412, 1422, etc.), which adheres to the substrate, embeds the connected components. Metal posts (1431, 1432, etc.) traverse the encapsulation compound vertically, connecting the substrate vias with pads on the encapsulation surface. The pads are covered with solder bodies used to connect to the next-level device array so that a 3-dimensional system of packaged devices is formed.

5 Claims, 13 Drawing Sheets

ARRAY-PROCESSED STACKED SEMICONDUCTOR PACKAGES

This is a divisional application of application Ser. No. 11/460,101, filed Jul. 26, 2006, the contents of which are herein incorporated by reference in its entirety.

FIELD OF THE INVENTION

The present invention is related in general to the field of semiconductor devices and processes, and more specifically to array-processed stacked semiconductor packages creating 3-dimensionally interconnected chips.

DESCRIPTION OF THE RELATED ART

The long-term trend in semiconductor technology to double the functional complexity of its products every 18 months (Moore's "law") has several implicit consequences. First, the higher product complexity should largely be achieved by shrinking the feature sizes of the chip components while holding the package dimensions constant; preferably, even the packages should shrink. Second, the increased functional complexity should be paralleled by an equivalent increase in reliability of the product. Third, the cost per functional unit should drop with each generation of complexity so that the cost of the product with its doubled functionality would increase only slightly.

As for the challenges in semiconductor packaging, the major trends are efforts to shrink the outline of a discrete package so that the package consumes less area and less height when it is mounted onto the circuit board, and to reach these goals with minimum cost (both material and manufacturing cost). Recently, another requirement was added to this list, namely the need to design packages so that stacking of chips and/or packages becomes an option to increase functional density and reduce device thickness. Furthermore, it is expected that a successful strategy for stacking chips and packages would shorten the time-to-market of innovative products, which utilize available chips of various capabilities (such as processors and memory chips) and would not have to wait for a redesign of chips.

Recent applications especially for hand-held wireless equipments, combined with ambitious requirements for data volume and high processing speed, place new, stringent constraints on the size and volume of semiconductor components used for these applications. Consequently, the market place is renewing a push to shrink discrete semiconductor devices both in two and in three dimensions, and this miniaturization effort includes packaging strategies for semiconductor devices as well as electronic systems.

SUMMARY OF THE INVENTION

Applicants recognize the need for a fresh concept of achieving a coherent, low-cost method of assembling high lead count, yet low contour devices. The concept includes substrates and packaging methods for stacking devices and package-on-package options as well as assembly options for flip-chip and wire bond interconnections. The device can be the base for a vertically integrated semiconductor system, which may include integrated circuit chips of functional diversity and passive components. The resulting system should have excellent electrical performance, especially speed, and high product reliability. Further, it will be a technical advantage that the fabrication method of the system is flexible enough to be applied for different semiconductor product families and a wide spectrum of design and process variations.

One embodiment of the invention is a semiconductor system of arrays of packaged devices. Each array includes a sheet-like substrate made of insulating material integral with conductive horizontal lines and vertical vias, and terminals on the surfaces. Semiconductor components, which may include more than one active or passive chip, are attached to the substrate; the electrical connections may include flip-chip, wire bond, or combination techniques. Encapsulation compound, which adheres to the substrate, embeds the connected components. Metal posts traverse the encapsulation compound vertically, connecting the substrate vias with pads on the encapsulation surface. The pads are covered with solder bodies used to connect to the next-level device array so that a 3-dimensional system of packaged devices is formed.

In another embodiment of the invention, the system includes a distribution of the encapsulation compound so that the compound thickness over the components is about equal to the substrate thickness. A balanced distribution of insulators is thus created, which and thus an overall system with a high degree of robustness against thermomechanical stress and distortion.

Another embodiment of the invention is a method for fabricating a semiconductor system, in which arrays of semiconductor packages are processed and then stacked to produce a 3-dimensional system of packaged components. The system can be sawed into individual stacks of packaged devices. The method starts with a substrate such as a laminate tape with metal traces patterned on the top layer. A chip is attached to the top layer; the attachment may be performed by flip-chip technique, or by wire bonded technique. In the flip-chip version, metal posts are built up on suitable pads on the top substrate layer; the posts need to be high enough to allow connection to the next package layer to be stacked. In the wire bond version, wire loops are created on the top chip layer in addition to metal posts; these loops need to be high enough to allow connection to the next package layer to be stacked. The wire bond option allows direct chip connect to the upper stacked package.

The assembly is then overmolded so that the mold compound reaches about the same thickness as the height of the posts and wire bonds and loops. The posts and bond wires are exposed using a post mold etch (wet or dry) or a polishing procedure. For the exposed wire bond version, s landing pad is deposited on the exposed wire to enable the package interconnect; the pad can also be used for routing. The molding step can be performed so that a balanced distribution of compound is achieved. The balanced stack option yields a mechanically resilient solution for the package stacks.

The array is bonded to the next array using solder attachment on the metallization (alternatively, thermo-compression bonding may be used). The reflow of multiple stacked packages occurs at one time for the whole array. To enhance the strength of the package, the substrate (laminate tape) can be glued or bonded to a mold cap; a mask protecting the posts/bondwires would be required for this step. Between two package levels, a single ground plane can be shared.

The technical advances represented by certain embodiments of the invention will become apparent from the following description of the preferred embodiments of the inven-

DETAILED DESCRIPTION OF THE PREFERRED EMBODIMENTS

Figure 1:
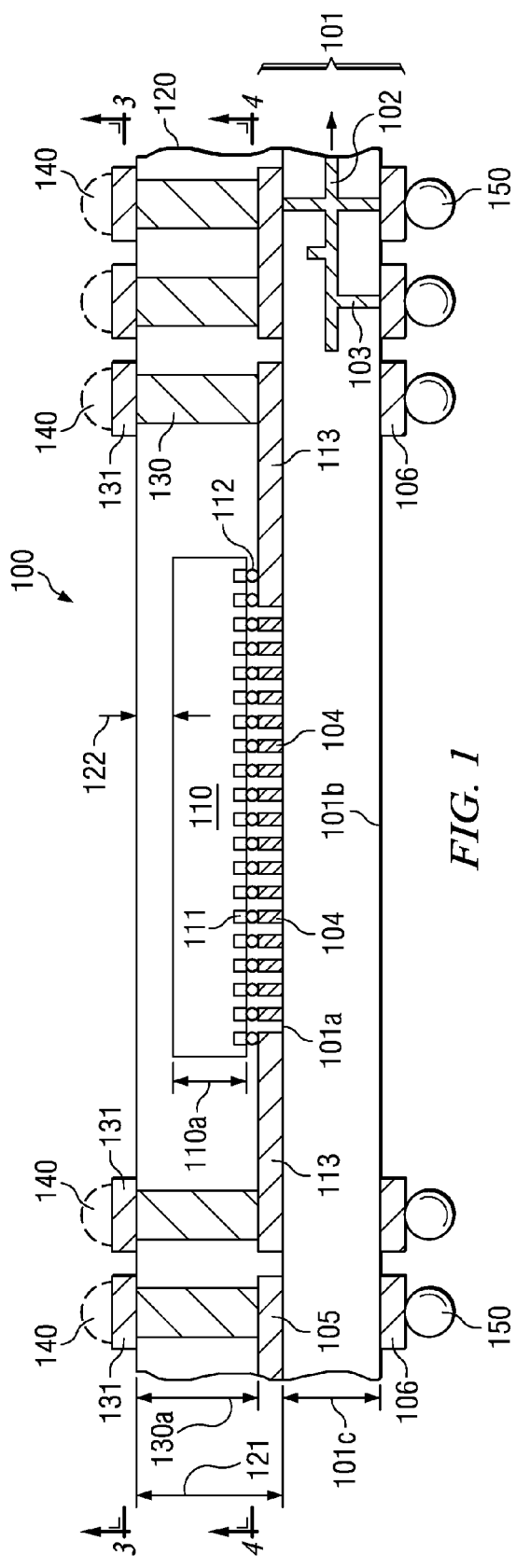
FIG. 1 shows a schematic cross section of a portion of an array including a semiconductor component flip-assembled on a substrate and embedded in encapsulation compound, which is traversed by metal posts.
Figure 5:
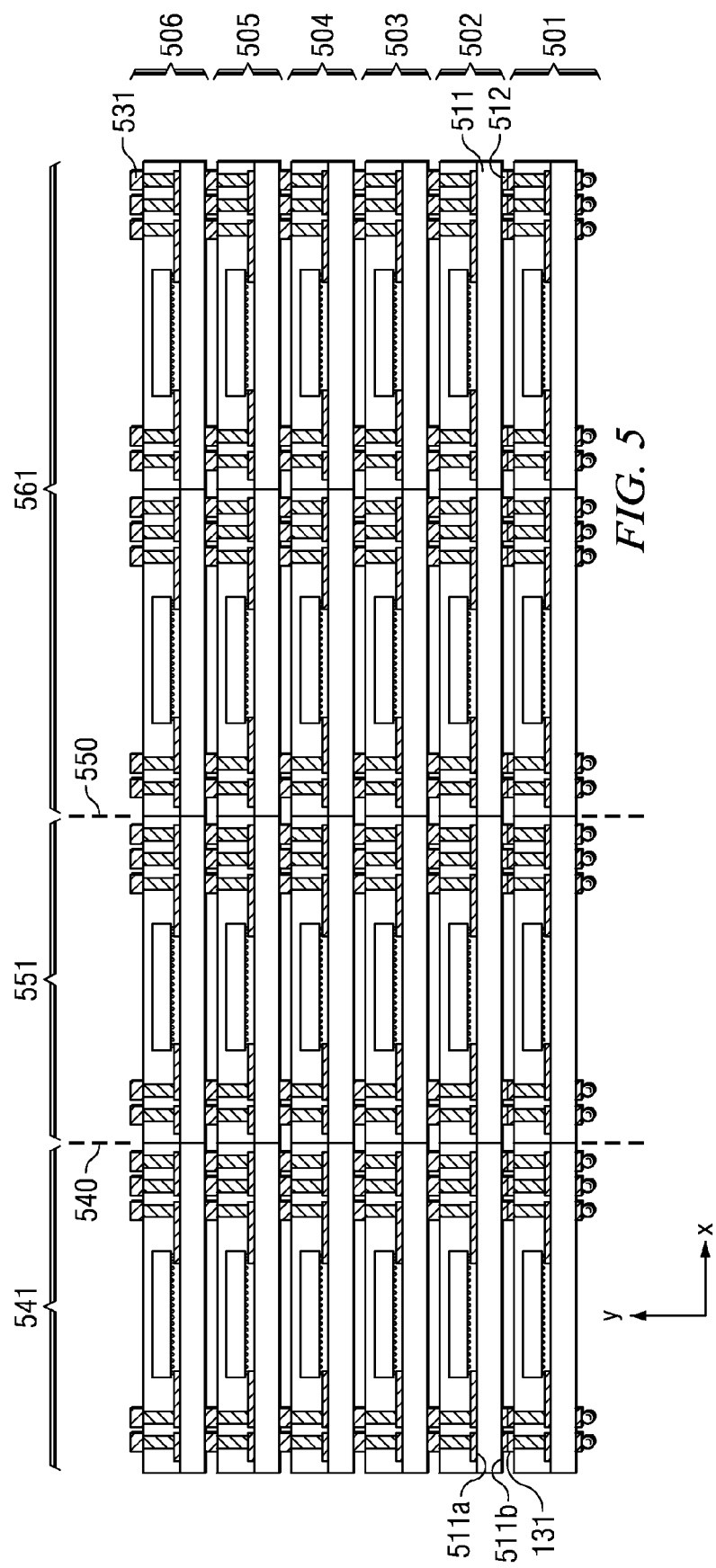
FIG. 5 is a schematic cross section of a stacked system of arrays including units assembled in the manner as illustrated in FIG. 1.

FIG. 1 illustrates a portion, generally designated 100, of an array shown more fully in FIG. 5. Actually it is, in FIG. 5, the first array of several arrays, which together form a semiconductor system. The first array consists of one or more assembly sites as depicted in FIG. 1; in FIG. 5, each array includes four assembly sites; arrays with considerably higher number of assembly sites can be manufactured. In addition, the sites may be arranged in x-direction as well as in y-direction; the number of sites may be different in x- and y-direction.

The assembly site depicted in FIG. 1 shows a substrate 101, which has a first surface 101a and a second surface 101b. The substrate is preferably made of a sheet-like insulating material such as polyimide- and/or epoxy-based compounds and has a thickness 101c in the range from about 10 to 1000 μm. Between surfaces 101a and 101b are layers 102 of conductive horizontal lines (preferably copper), and extending from surfaces 101a to surface 101b is a network of conductive vertical vias 103 (preferably copper).

Substrate 101 has on the first surface 101a two sets of terminals. The terminals 104 of the first set are attachment sites and have a metallurgical surface composition suitable for metallic connection such as solder bumps or gold studs. A preferred surface composition is a layer of nickel with a top layer of palladium or gold. Substrate 101 further has a second set of terminals 105 on the first surface 101a, and a third set of terminals 106 on the second surface 101b. Preferred metal for terminals 105 and 106 is copper; terminals 106 are suitable for attachment of solder bodies.

In FIG. 1, a semiconductor component 110 with I/O ports 111 is flip-attached to the substrate attachment sites (first set terminals 104) by means of connector bodies 112, preferably metal studs such as gold of copper bumps. Component 110 may be a discrete component, an integrated circuit chip, or it may include a passive component such as capacitor, an inductor, or a resistor. The thickness 110a of the component may vary from 10 to 400 μm; thicker or thinner components can be assembled.

It should be stressed that in an array, the type of chips, the size of the chips, and the thickness of the chips may vary from assembly site to assembly site; consequently, one assembly site may have an integrated circuit, the adjacent site a passive component, the next site a silicon controlled rectifier, etc.

Component 110 is attached onto substrate 101 by the flip-chip technique, active face down. FIG. 1 also shows an example of an electrical connection 113 from the component 110 to substrate terminals 105 on first surface 101a.

On at least portions of the second set terminals 105 on the first substrate surface 101a are metal posts 130, preferably made of copper or a copper alloy. The location of the posts matches at least portions of the third set terminals 106 on the second substrate surface 101b. Posts 130 are preferably about vertical to the first substrate surface 101a and have a height 130a taller than the component thickness 110a. The posts serve the vertical electrical connectivity and have, therefore, a diameter sufficiently wide to keep losses from inductive and capacitive resistance minimal. The posts rest on terminals 105; on the top end, the posts are capped by pads 131.

In FIG. 1, encapsulation compound 120 adheres to first substrate surface 101a and embeds the connected component 110. The thickness 121 of the compound is preferably at least equal to, but more preferably greater than the sum of the thicknesses of component, connectors, and terminals; thickness 121 is about equal to post height 130a. Preferably, the encapsulation material 120 is an epoxy-based molding compound, which is processed by the transfer molding technique.

Figure 2:
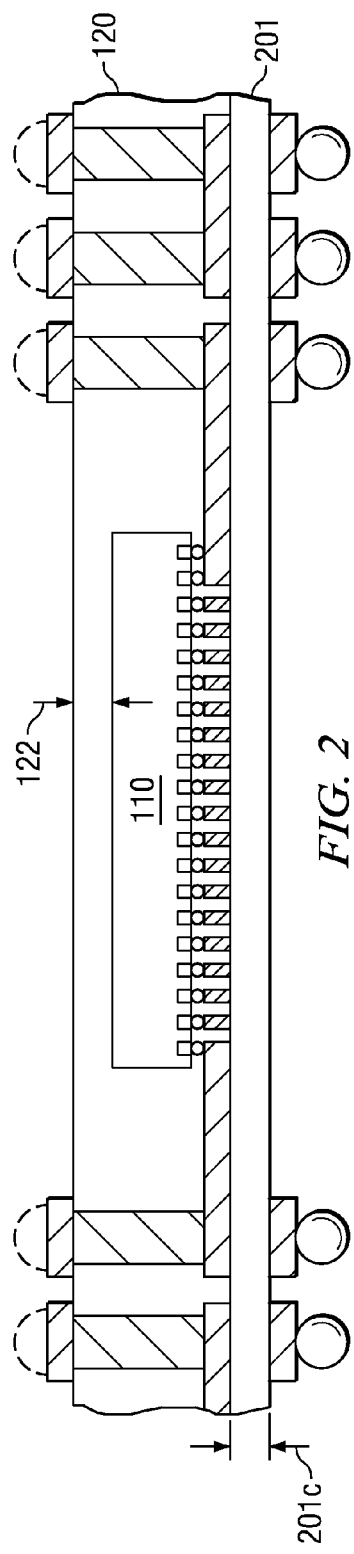
FIG. 2 depicts the schematic array portion of FIG. 1 for the case of equal thicknesses of the substrate and the encapsulation compound on top of the component.

The most preferable structure has an encapsulation compound thickness 122 on top of the component 110 about equal to the thickness 201c of substrate 201. FIG. 2 illustrates an embodiment with this "balanced distribution" of polymers (encapsulation compound and insulating substrate). Experience has shown that a balanced distribution of polymers embedding a semiconductor component contributes to equalize compressive stress on the component and to yield a mechanically resilient array structure.

Referring now to FIG. 1, attached to pads 131 are reflow metal bodies 140, preferably made of tin or a tin alloy. These reflow bodies 140 have a first reflow temperature and interconnect the first array with other arrays. After the assembly of all arrays into the semiconductor system, reflow bodies 150 may be attached to terminals 106 on the second substrate surface 101b. The reflow temperature of bodies 150 is lower than the reflow temperature of bodies 140.

Figure 3:
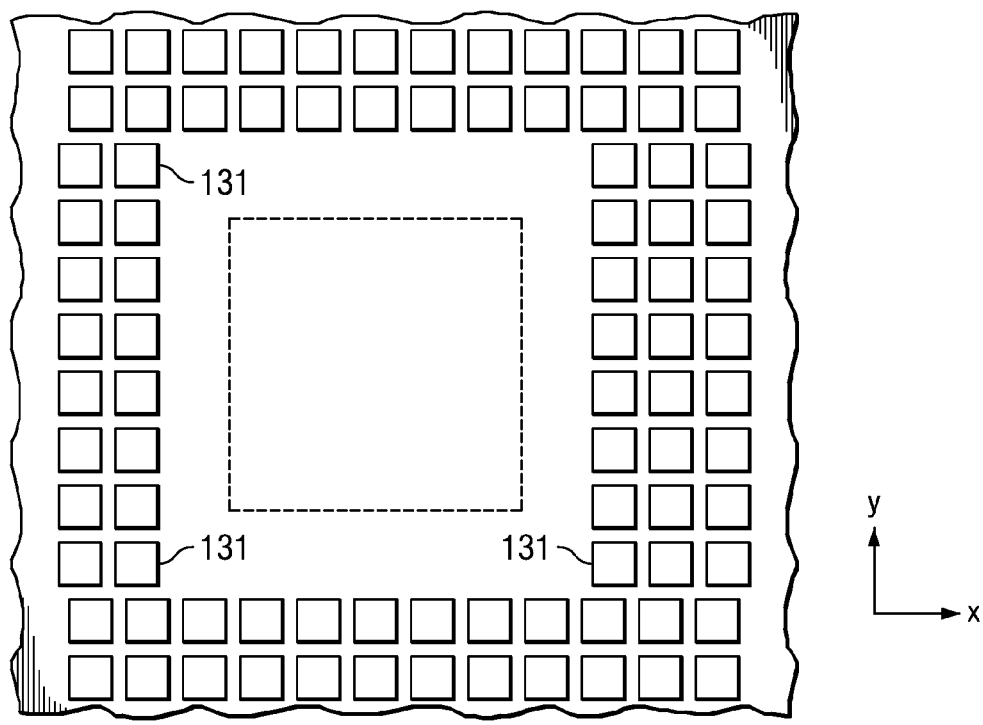
FIG. 3 shows a schematic top view of the array portion of FIG. 1 along the cut line A-A.
Figure 4:
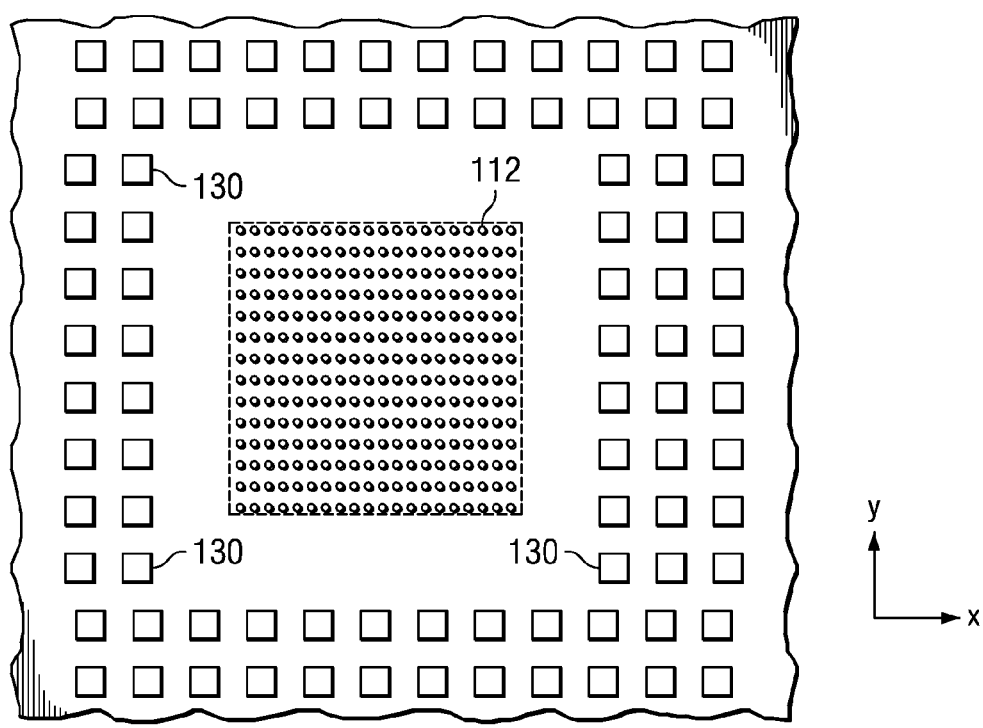
FIG. 4 shows a schematic top view of the array portion of FIG. 1 along the cut line B-B.

A cross section along cut line A-A in FIG. 1 will provide a top view as illustrated in FIG. 3. The rows of pads 131 are shown in x- and y-direction. A cross section along cut line B-B in FIG. 1 will provide a bottom view as illustrated in FIG. 4. The rows of posts 130 are shown in x- and y-direction. In addition, the two-dimensional array of metal studs 112 on I/O ports 111 are indicated as round entities.

Figure 11:
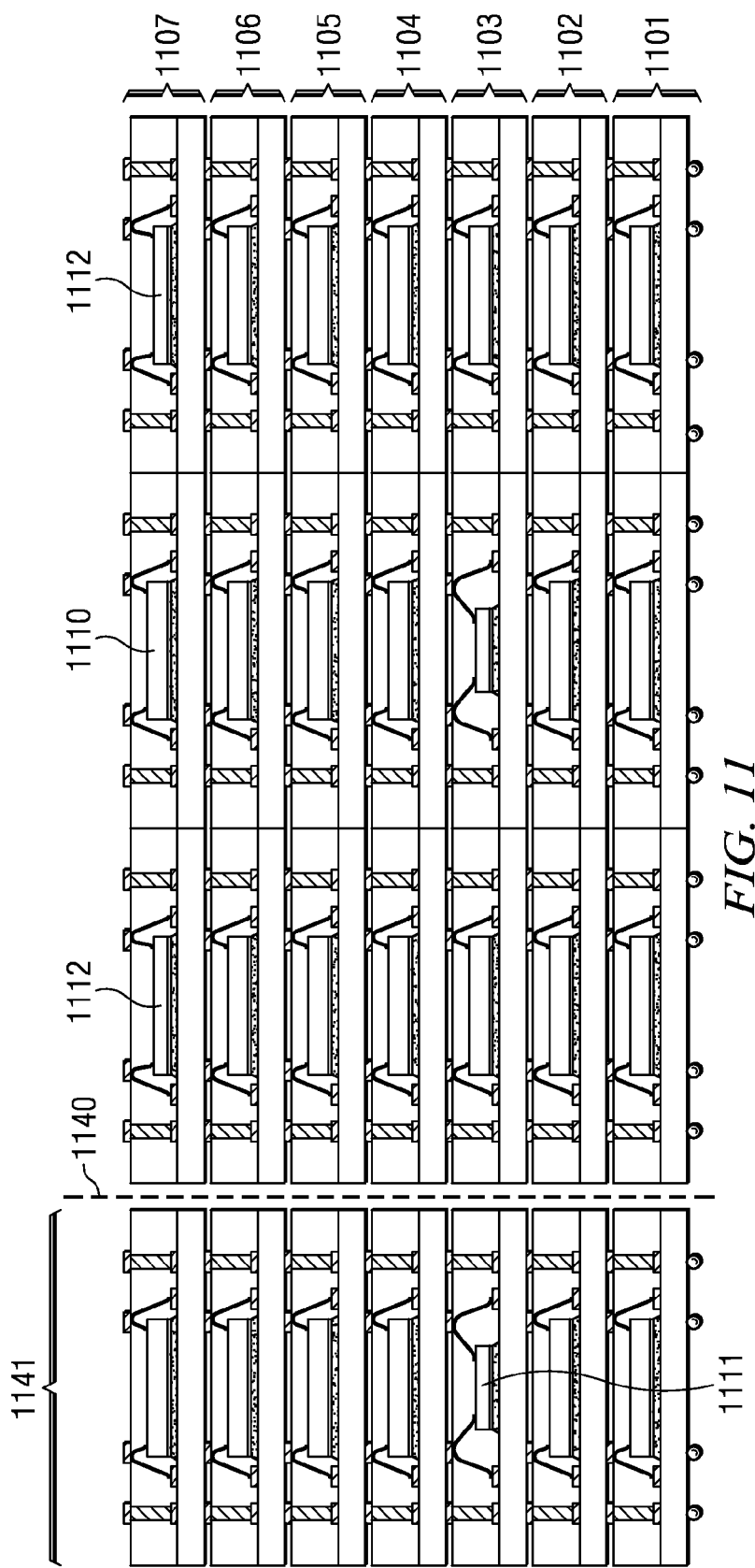
FIG. 11 illustrates a schematic cross section of a stacked system of arrays including units with semiconductor components of different sizes or thicknesses.

The first array of the embodiment under discussion is composed of units as described in FIG. 1. A complete array composed of 4 such units is illustrated in FIG. 5 in a simplified manner; the array is designated 501. The array has the same type component flip-assembled in each of the four units. In other embodiments, components for different sizes, thicknesses, and device types may be assembled as an array (an embodiment using different assembly technique is shown in FIG. 11).

A second array 502 of packaged devices is structured analogous to array 501, based on units assembled as shown in FIG. 1. The array has a sheet-like substrate 511 with a third surface 511a and a fourth surface 511b, and terminals on the both surfaces. The terminals 512 on the fourth surface match the pads 131 (covered with reflow metal) of the first array 501.

The second array 502 is aligned and connected with the first array 501 at the matching terminals 512 and 131 to form a 3-dimensional system of packaged devices.

A third array to an $n^{th}$ array of packaged devices has a structure analogous to the structure of array 502 and 501. In FIG. 5, these arrays are designated 503, 504, 505, and 506. These arrays have reflow metal of the same reflow temperature on all pads. After alignment, the reflow metals of all arrays are thus connected in one process step (see below). The result is a 3-dimensional system of packaged devices. In the side view of FIG. 5, 4 devices in the x-direction and 6 devices in the y-direction are shown. Taking a top view of the pads 531 on the metal posts of top array 506 delivers FIG. 6. In the top view of FIG. 6, 4 devices in the x-direction and 4 devices in the z-direction are shown. Combining the views of FIG. 5 and FIG. 6 indicates that the complete 3-dimensional system includes 4×6×4=96 packaged devices.

Figure 6:
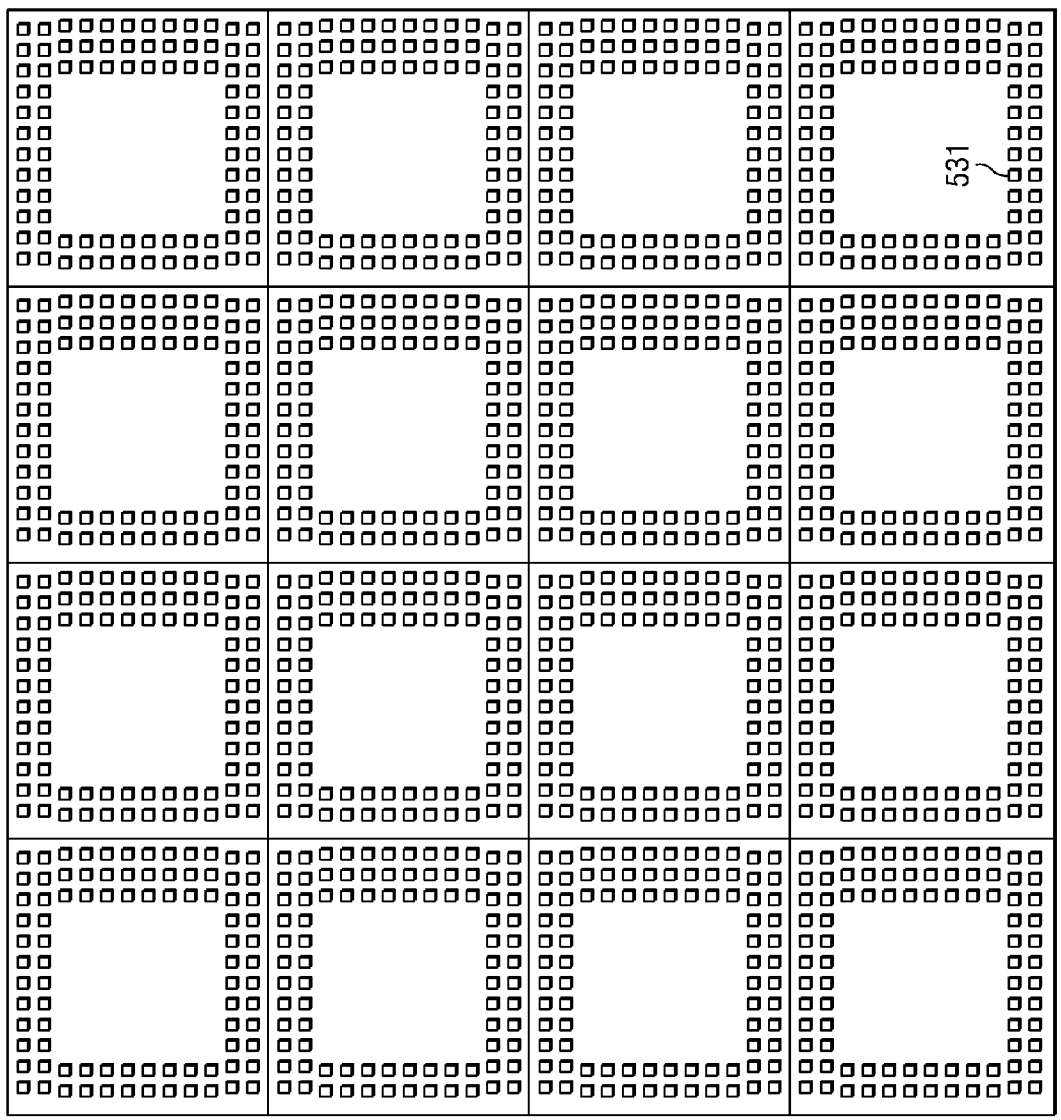
FIG. 6 is a schematic top view of the system shown in FIG. 5.

In the embodiment of FIGS. 5 and 6, the devices have identical components; as stated earlier, other embodiments have components of different types, sizes, and thicknesses; see also FIG. 11.

The system of FIGS. 5 and 6 may be singulated into vertical stacks of devices. Preferably using a saw, a cut along line 540 singulates a stack 541 including 1×6×4=24 packaged devices. A cut along line 550 singulates another stack of 1×6×4=24 packaged devices. The remaining stack 561 includes 2×6×4=48 packaged devices.

Figure 7:
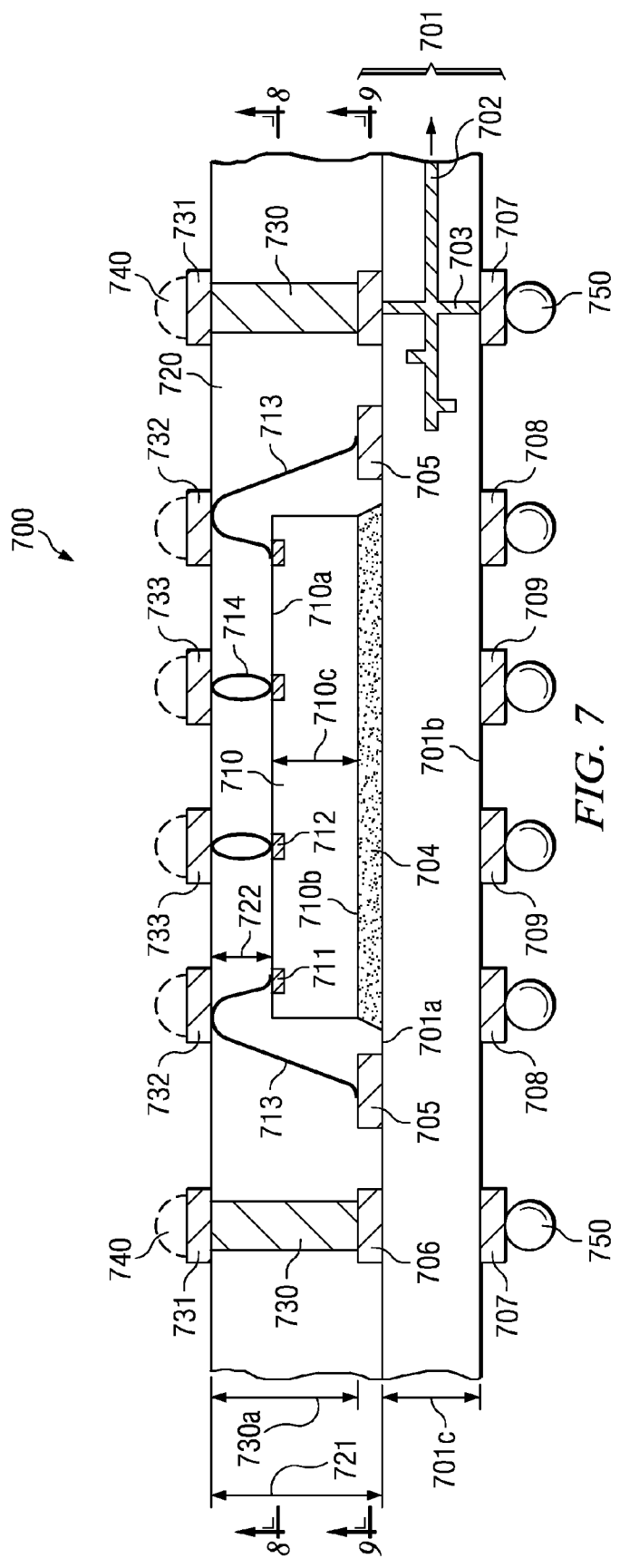
FIG. 7 shows a schematic cross section of a portion of an array including a semiconductor component attached to a substrate, wire bonded for electrical connection, and embedded in encapsulation compound, which is traversed by metal posts.

Another embodiment of the invention is depicted in FIGS. 7 to 14. FIG. 7 illustrates a portion, generally designated 700, of a first array shown more fully in FIG. 10. Actually it is, in FIG. 10, the first array of several arrays, which together form a semiconductor system. The first array consists of one or more assembly sites as depicted in FIG. 7; in FIG. 10, each array includes four assembly sites; arrays with considerably higher number of assembly sites can be manufactured. In addition, the sites may be arranged in x-direction as well as in y-direction; the number of sites may be different in x- and y-direction.

The assembly site depicted in FIG. 7 shows a substrate 701, which has a first surface 701a and a second surface 701b. The substrate is preferably made of a sheet-like insulating material such as polyimide- and/or epoxy-based compounds and has a thickness 701c in the range from about 10 to 1000 µm. Between surfaces 701a and 701b are layers 702 of conductive horizontal lines (preferably copper), and extending from surfaces 701a to surface 701b is a network of conductive vertical vias 703 (preferably copper).

Substrate 701 may have an array of assembly sites; one of these sites is illustrated in FIG. 7. Substrate 701 has on the first surface 701a a chip attachment location 704 and two sets of terminals. The terminals 705 of the first set are in proximity of component 710, preferably made of copper and have a metallurgical surface composition suitable for wire bonding (for example gold surface layer). Substrate 701 further has a second set of terminals 706 on the first surface 701a, preferably made of copper and with a metallurgical surface composition for metal post deposition (preferably copper).

A third, a fourth, and a fifth set of terminals are on the second surface 701b. Preferred metal for these terminals is copper; they are suitable for attachment of solder bodies. The location of the third set terminals 707 match the metal posts 730; the location of the fourth set terminals 708 match the contact pads 732 on the wire span tops; and the location of the fifth set terminals 709 match the contact pads 733 on the wire loop tops.

In FIG. 7, a semiconductor component 710 has an active surface 710a, a passive surface 710b, and a thickness 710c. Component 710 is attached with its passive surface 710b onto substrate attachment location 704. On the active surface 710a, the component has a first set of I/O ports 711, which serve as bond pads for the wire spans, and a second set of I/O ports 712, which serve as bond pads for the wire loops. Component 710 may be a discrete component, an integrated circuit chip, or it may include a passive component such as capacitor, an inductor, or a resistor. The thickness 710c of the component may vary from 10 to 400 µm; thicker or thinner components can be assembled.

FIG. 7 shows two modes of electrical connection for component 710. Bond wire spans 713 connect the first set ports 711 with the respective first set terminals 705. The wire spans reach a certain height over the active component surface. Bond wire loops 714 are on each second set port 712. The tops of all loops 714 are in the same plane as the tops of the wire spans 713; the loops 714 reach the same height over the active component surface as the wire spans 713.

On at least portions of the second set terminals 706 on the first substrate surface 701a are metal posts 730, preferably made of copper or a copper alloy. The location of the posts matches the third set terminals 707 on the second substrate surface 701b. Posts 730 are preferably about vertical to the first substrate surface 701a and have a height 730a taller than the sum of the component thickness 710c and the wire loop height. The posts serve the vertical electrical connectivity and have, therefore, a diameter sufficiently wide to keep losses from inductive and capacitive resistance minimal. The posts rest on terminals 706; on the top end, the posts are capped by pads 731. These pads match the locations of the third set terminals 707 on the second substrate surface 701b.

In addition, the tops of the wire spans and the wire loops have contact pads. In FIG. 7, pads 732, contacting the wire span tops, match the locations of the fourth set terminals 708; pads 733, in contact with the wire loop tops, match the fifth set terminals 709.

In FIG. 7, encapsulation compound 720 adheres to first substrate surface 701*a* and embeds the connected component 710. The thickness 721 of the compound is about equal to post height 730*a*. Preferably, the encapsulation material 720 is an epoxy-based molding compound, which is processed by the transfer molding technique.

The most preferable structure has an encapsulation compound thickness 722 on top of the active surface 710*a* of component 710 about equal to the thickness 701*c* of substrate 701. Experience has shown that a "balanced distribution" of polymers (encapsulation compound and insulating substrate) embedding a semiconductor component contributes to equalize compressive stress on the component and to yield a mechanically resilient array structure.

Attached to pads 731 are reflow metal bodies 740, preferably made of tin or a tin alloy. These reflow bodies 740 have a first reflow temperature and interconnect the first array with other arrays. After the assembly of all arrays into the semiconductor system, reflow bodies 750 may be attached to terminals 707, 708, and 709 on the second substrate surface 701*b*. The reflow temperature of bodies 750 is lower than the reflow temperature of bodies 740.

Figure 8:
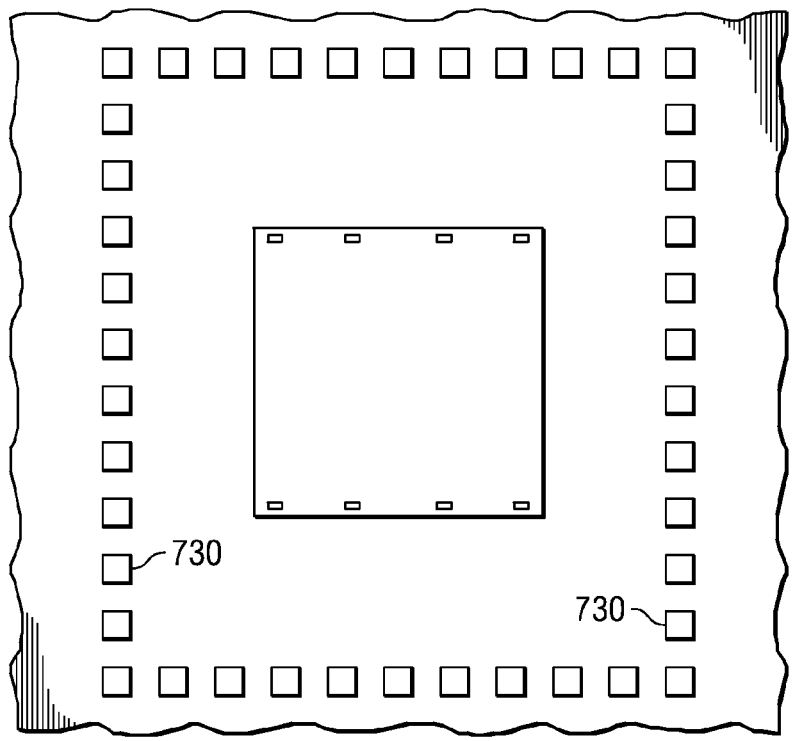
FIG. 8 shows a schematic top view of the array portion of FIG. 7 along the cut line A-A.
Figure 9:
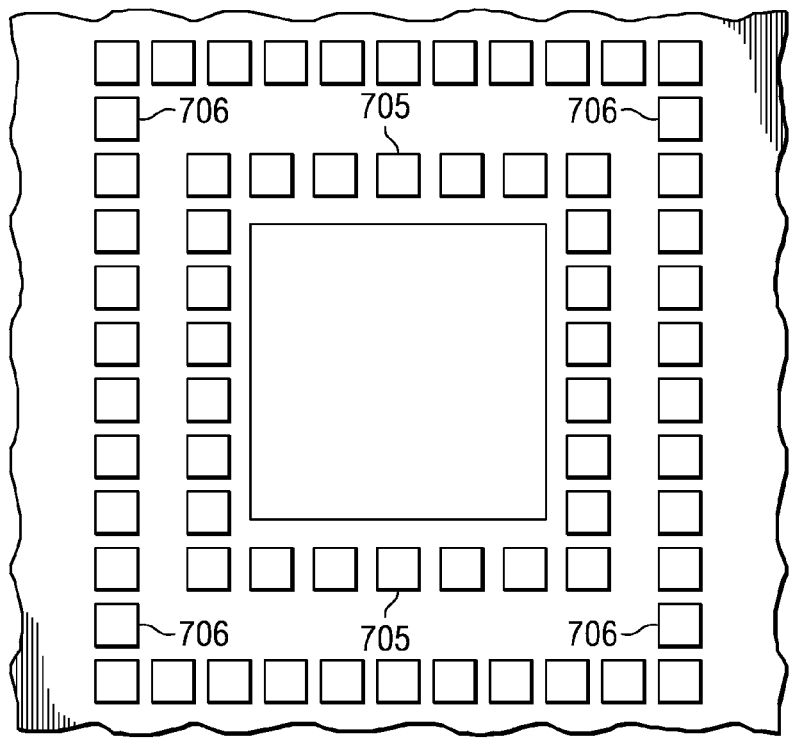
FIG. 9 shows a schematic top view of the array portion of FIG. 7 along the cut line B-B.

A cross section along cut line A-A in FIG. 7 provides a top view as illustrated in FIG. 8. The rows of posts 730 are shown in x- and y-direction. A cross section along cut line B-B in FIG. 7 provides a bottom view as illustrated in FIG. 9. The rows of first set terminals 705 and second set terminals 706 are shown in x- and y-direction.

Figure 10:
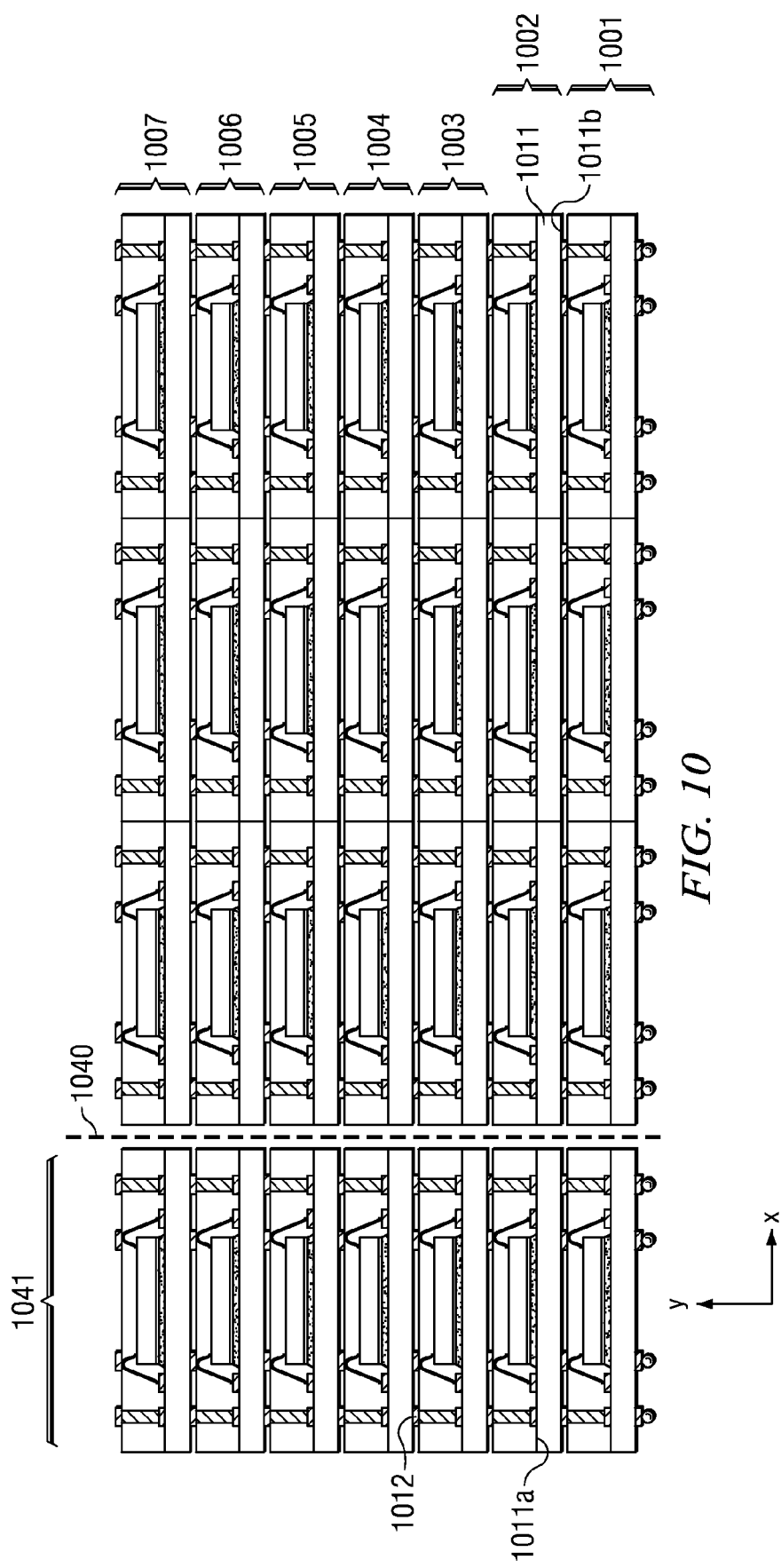
FIG. 10 is a schematic cross section of a stacked system of arrays including units assembled in the manner as illustrated in FIG. 7.

The first array of the embodiment under discussion is composed of units as described in FIG. 7. A complete array composed of 4 such units is illustrated in FIG. 10 in a simplified manner; the array is designated 1001. The array has the same type component wire-assembled in each of the four units. In other embodiments, components for different sizes, thicknesses, and device types may be assembled as an array (an embodiment is shown in FIG. 11).

A second array 1002 of packaged devices is structured analogous to array 1001, based on units assembled as shown in FIG. 7. Array 1002 has a sheet-like substrate 1011 with a third surface 1011*a* and a fourth surface 1011*b*, and terminals on the both surfaces. The terminals 1012 on the fourth surface match the pads 731, 732, and 733 (covered with reflow metal, see FIG. 7) of the first array 1001.

The second array 1002 is aligned and connected with the first array 1001 at the matching terminals 1012 and 731, 732, and 733 to form a 3-dimensional system of packaged devices.

A third array to an $n^{th}$ array of packaged devices has a structure analogous to the structure of array 1002 and 1001. In FIG. 10, these arrays are designated 1003, 1004, 1005, 1006, and 1007. These arrays have reflow metal of the same reflow temperature on all pads. After alignment, the reflow metals of all arrays are thus connected in one process step (see below). The result is a 3-dimensional system of packaged devices. In the side view of FIG. 10, 4 devices in the x-direction and 7 devices in the y-direction are shown.

In the embodiment of FIG. 10, the devices have identical components; as stated earlier, other embodiments have components of different types, sizes, and thicknesses. An example of these embodiments is illustrated in FIG. 11. Arrays 1101, 1102, 1104, 1105, and 1106 include components 1110 of equal size and thickness, assembled by bond wires; the device type may be different, however. Arrays 1103 and 1107 include components 1110, 1111, 1112 of different size and thickness, assembled by wire bonds.

The systems of FIGS. 10 and 11 may be singulated into vertical stacks of devices. Preferably using a saw, a cut along line 1040 in FIG. 10 and line 1140 in FIG. 11 singulates a stack of packaged devices. In FIG. 10, the stack is designated 1041; it includes 1×7×1=7 packaged devices under the assumption that there is only 1 device in the z-direction. In FIG. 11, the stack is designated 1141; it includes 1×7×1=7 packaged devices under the assuming that there is only one device in the z-direction. The remaining stacks in FIG. 10 and FIG. 11 include 3×7×1=21 packaged devices each.

Figure 12:
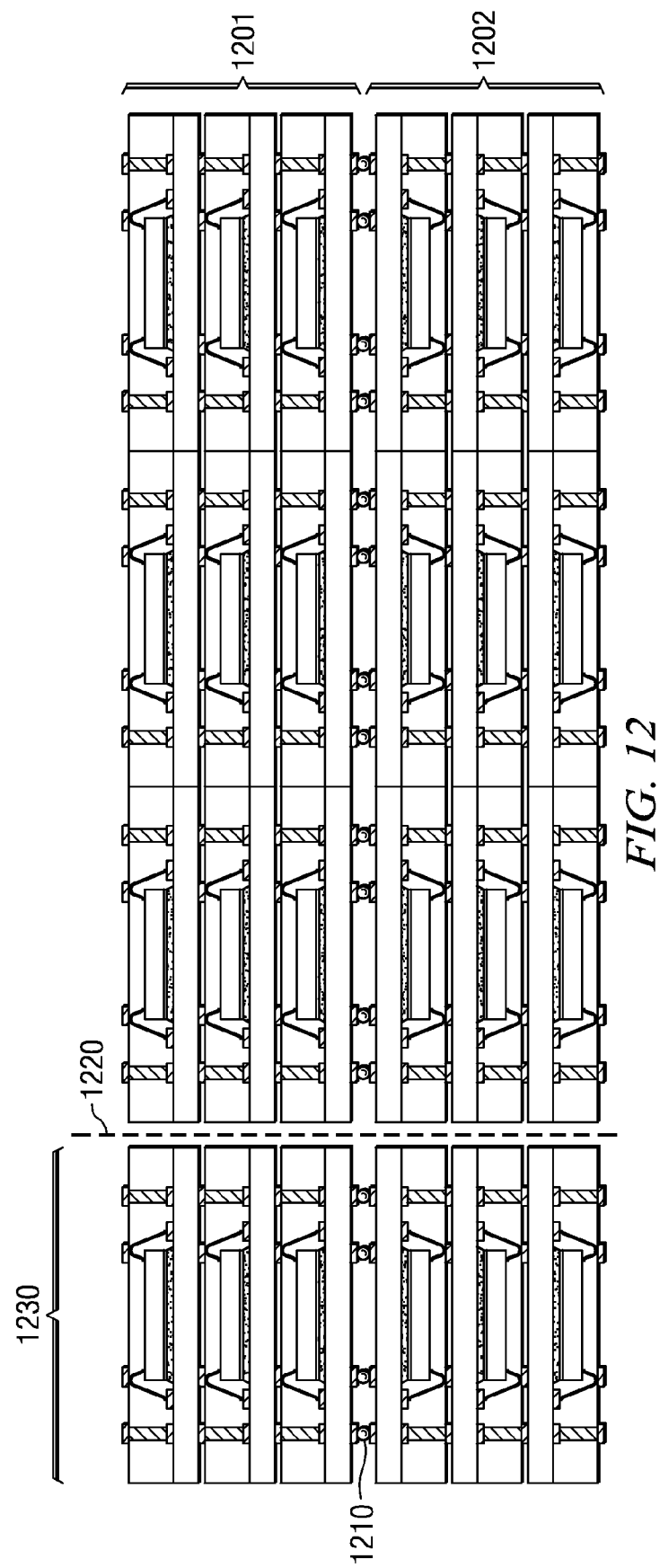
FIG. 12 depicts a schematic cross section of a balanced stacked system of arrays.

The schematic and simplified FIG. 12 illustrates another embodiment of array-processed stacked semiconductor packages, which emphasizes the balancing of the stack for a mechanically resilient stack-up solution. In subassembly 1201, three arrays of packaged devices are assembled as a system using the method described in FIG. 10. Similarly, in subassembly 1202, three arrays of packaged of packaged devices are assembled as a system using the process described in FIG. 10. Then, subassembly 1202 is flipped relative to subassembly 1201 and soldered onto subassembly 1201, using the matching reflow bodies 1210. As pointed out above, the reflow temperature of bodies 1210 is lower than the reflow temperature of the reflow bodies used earlier in the assembly of the subassemblies; see description for FIG. 10. A cut along line 1220 singulates stack 1230. This stack exhibits carefully balanced mechanical characteristics for resiliency and stress robustness.

Figure 13:
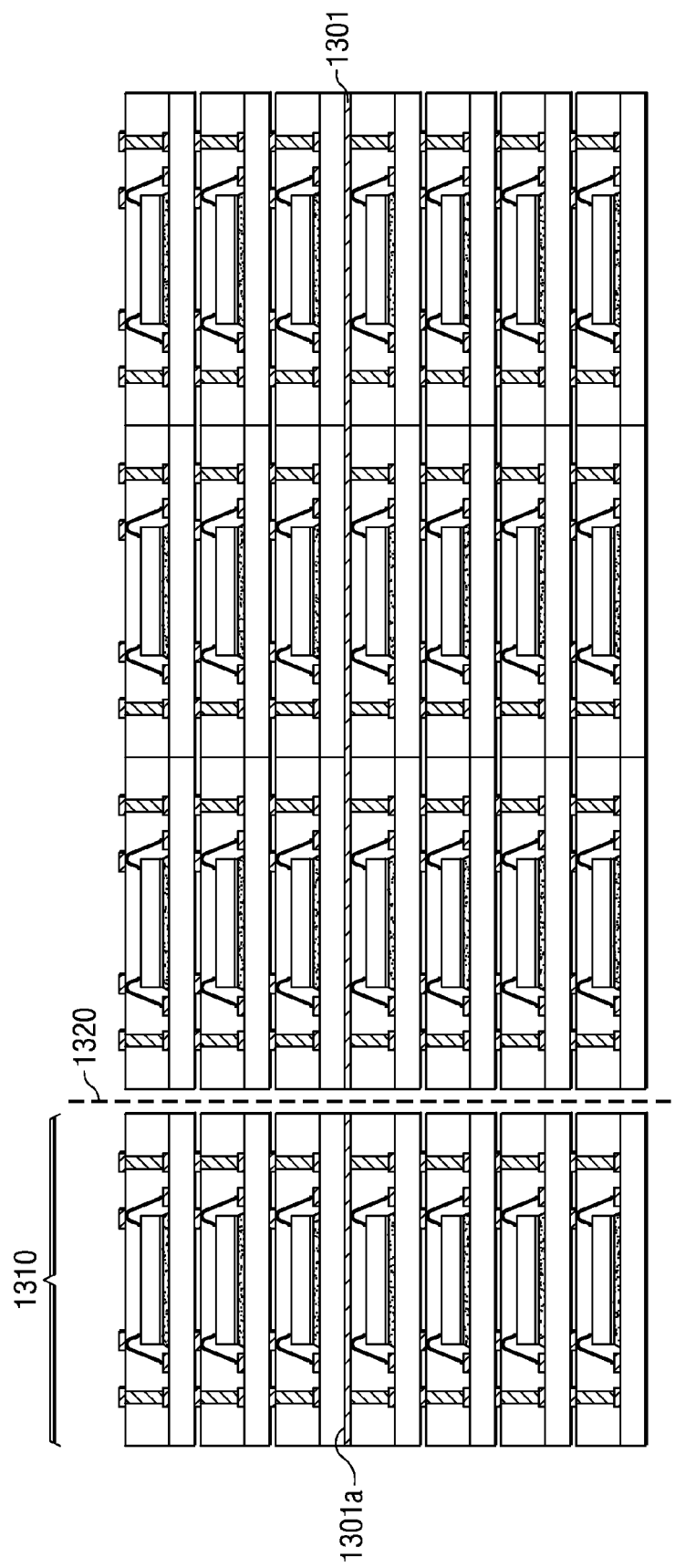
FIG. 13 shows a schematic cross section of a stacked system of arrays, which share an electrical ground plane.

FIG. 13 depicts an embodiment, in which a single ground plane 1301 is shared by two or more array-assembled packages in a stack. As an example, after singulating the stack 1310 from the assembled arrays along cut-line 1320, the ground plane portion 1301*a* serves the seven packaged devices of stack 1310.

Figure 14:
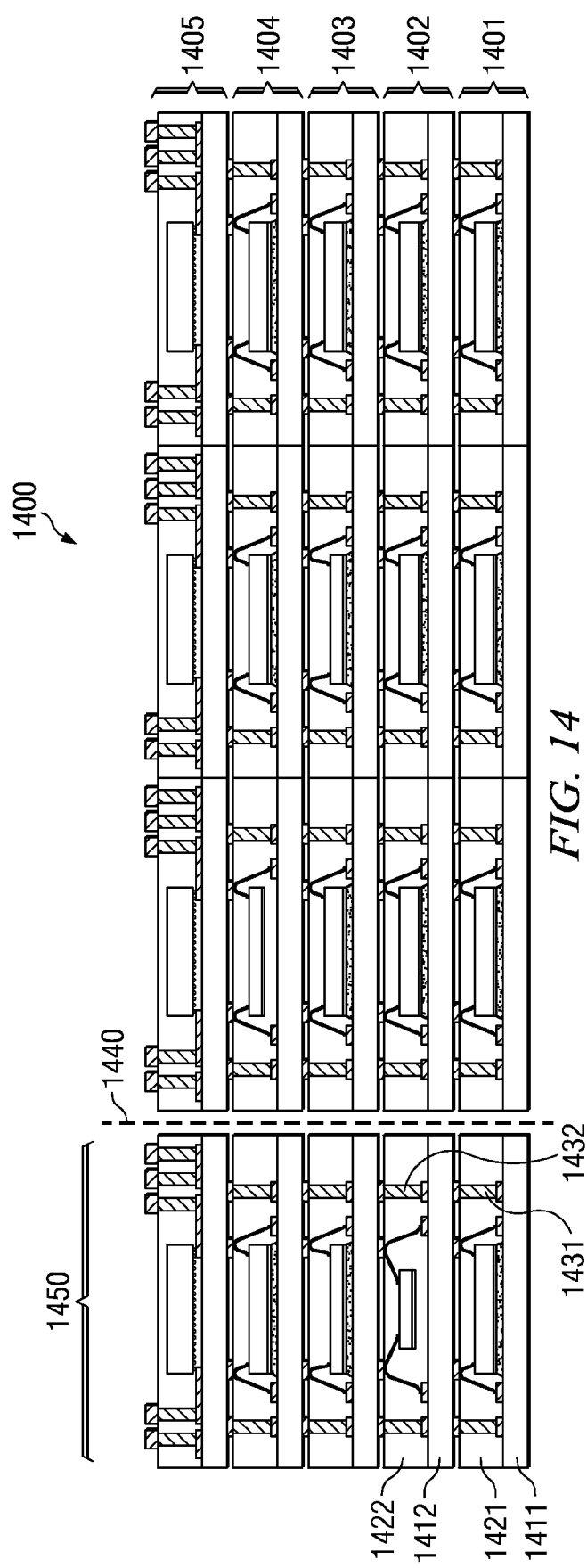
FIG. 14 illustrates a schematic cross section of a stacked system of arrays, wherein the arrays include semiconductor components of different sizes or thicknesses and of different assembly techniques.

FIG. 14 illustrates another embodiment, generally designated 1400, of the invention. In this example, the arrays 1401, 1402, 1403, and 1404 (containing four units each) have been processed by wire bonding as described in FIG. 7, and array 1405 has been processed by flip-chip technique as described in FIG. 1. Each array includes a sheet-like substrate (1411, 1412, etc.); the components may include one or more active or passive chips, or chips of different sizes. Encapsulation compound (1412, 1422, etc.), which adheres to the substrate, embeds the connected components. Metal posts (1431, 1432, etc.) traverse the encapsulation compound vertically. By means of the matching contact pads, all five arrays have been stacked by reflow assembly as a 3-dimensional system. Cutting along line 1440, a stack 1450 may be singulated. This stack includes a system of devices using mixed assembly technologies, wire bonding and flip-chip assembly, and also mixed component sizes.

Figure 15:
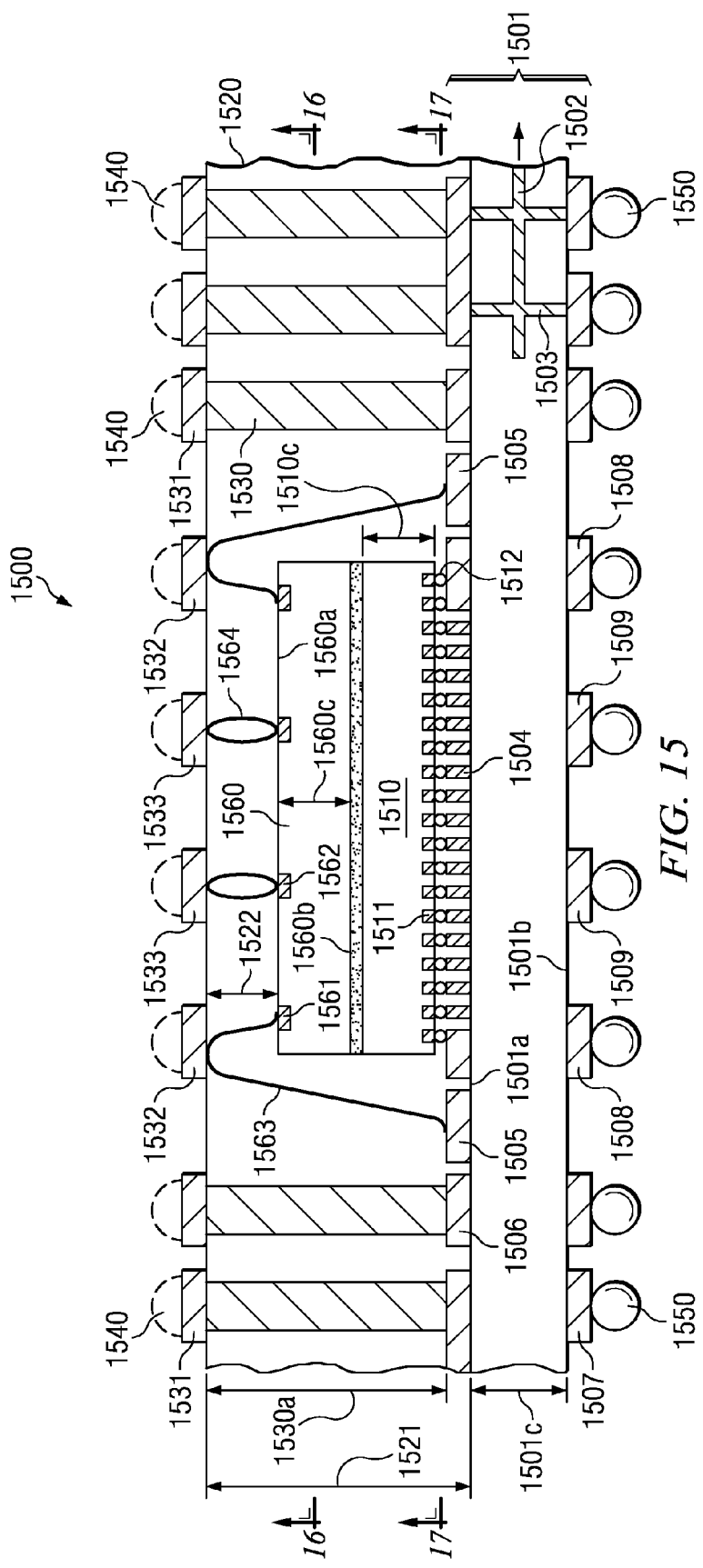
FIG. 15 shows a schematic cross section of a portion of an array including a stack of two semiconductor components; the first component is flip-assembled on a substrate and the second component is wire bonded to the substrate; the stack is embedded in encapsulation compound, which is traversed by metal posts.
Figure 16:
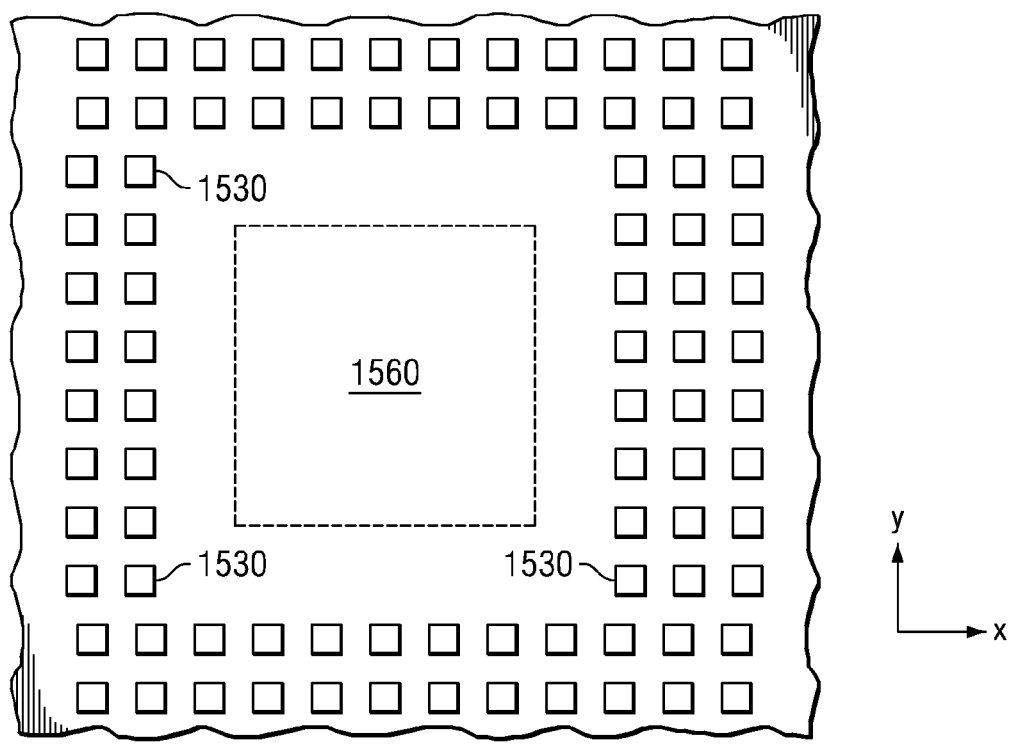
FIG. 16 shows a schematic top view of the array portion of FIG. 15 along the cut line A-A.
Figure 17:
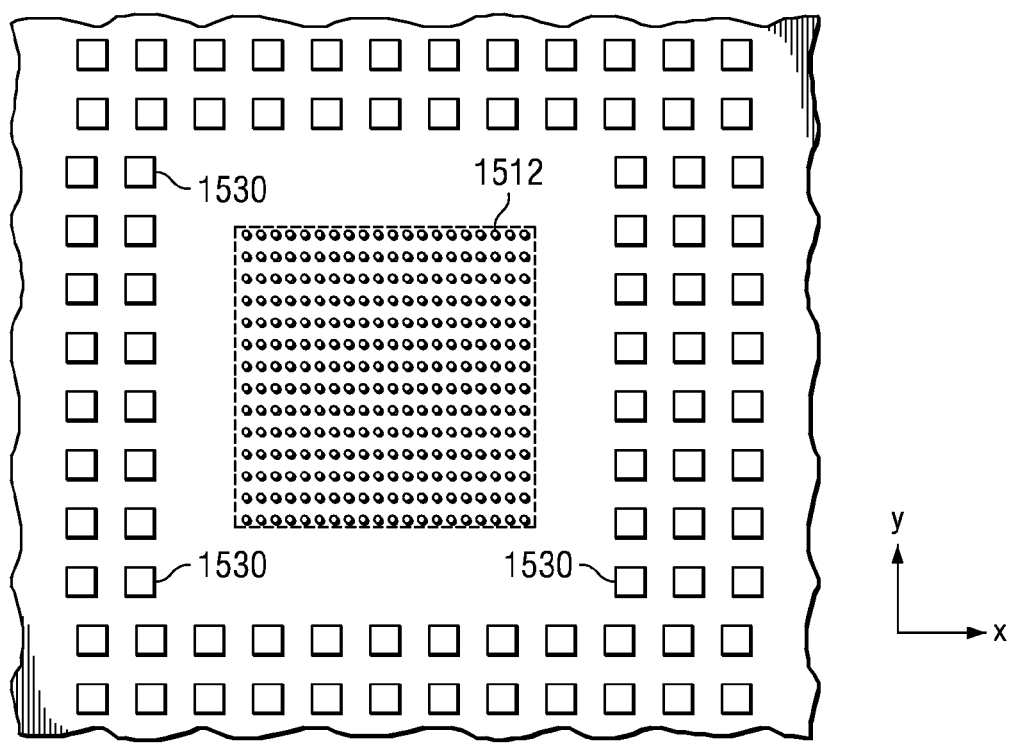
FIG. 17 shows a schematic top view of the array portion of FIG. 15 along the cut line B-B.

Another embodiment of the invention involving mixed assembly technologies is depicted in FIGS. 15 to 17. This embodiment concerns a stack of two or more chips, which are assembled by flip-chip as well as wire bonding techniques. FIG. 15 illustrates a portion, generally designated 1500, of an array. The assembly site depicted in FIG. 15 shows a substrate 1501, which has a first surface 1501*a* and a second surface 1501*b*. The substrate is preferably made of a sheet-like insulating material such as polyimide- and/or epoxy-based compounds and has a thickness 1501*c* in the range from about 10 to 1000 μm. Between surfaces 1501*a* and 1501*b* are layers 1502 of conductive horizontal lines (preferably copper), and extending from surfaces 1501*a* to surface 1501*b* is a network of conductive vertical vias 1503 (preferably copper).

Substrate 1501 may have an array of assembly sites; one of these sites is illustrated in FIG. 15. Substrate 1501 has on the first surface 1501*a* three set of terminals. The terminals 1504 of the first set are component attachment sites, preferably copper, and have a metallurgical surface composition suitable for metallic connection such as solder bumps or gold studs (preferably nickel with a top layer of palladium or gold). Terminals 1505 of the second set are in proximity of component 1510, preferably made of copper and have a metallurgical surface composition suitable for wire bonding (for example gold surface layer). Substrate 1501 further has a third set of terminals 1506 on the first surface 1501a, preferably made of copper and with a metallurgical surface composition for metal post deposition (preferably copper).

A fourth, a fifth, and a sixth set of terminals are on the second surface 1501b. Preferred metal for these terminals is copper; they are suitable for attachment of solder bodies. The location of the fourth set terminals 1507 match the metal posts 1530; the location of the fifth set terminals 1508 match the contact pads 1532 on the wire span tops; and the location of the sixth set terminals 1509 match the contact pads 1533 on the wire loop tops.

In FIG. 15, a first semiconductor component 1510 has an active surface with I/O ports 1511, a passive surface, and a thickness 1510c. Component 1510 is flip-attached with its active surface onto the substrate attachment sites (first set terminals 1504) by means of connector bodies 1512, preferably metal studs such as gold or copper bumps. Component 1510 may be a discrete component, an integrated circuit chip, or a passive component. Thickness 1510c may vary from 10 to 400 μm; thicker or thinner components can be assembled.

A second semiconductor component 1560 has an active surface 1560a with a first and second set of I/O ports, a passive surface 1560b, and a thickness 1560c. The first set of I/O ports 1561 serves as bond pads for the wire spans, and the second set of I/O ports 1562 serves as bond pads for the wire loops. Component 1560 may be a discrete component, an integrated circuit chip, or it may be a passive component. The thickness 1560c of the component may vary from 10 to 400 μm; thicker or thinner components can be assembled.

The passive surface 1560b of the second component 1560 is adhesively attached to the passive surface of the first component 1510.

FIG. 15 shows two modes of electrical connection for the components. Component 1510 is flip-attached and component 1560 is connected by wire bonds. Bond wire spans 1563 connect the first set ports 1561 with the respective first set terminals 1605. The wire spans reach a certain height over the active component surface. Bond wire loops 1564 are on each second set port 1562. The tops of all loops 1564 are in the same plane as the tops of the wire spans 1563; the loops 714 reach the same height over the active component surface as the wire spans 1563.

On at least portions of the third set terminals 1506 on the first substrate surface 1501a are metal posts 1530, preferably made of copper or a copper alloy. The location of the posts matches the fourth set terminals 1507 on the second substrate surface 1501b. Posts 1530 are preferably about vertical to the first substrate surface 1501a and have a height 1530a taller than the sum of the component thicknesses 1510c and 1560c, and the wire loop height. The posts serve the vertical electrical connectivity and have, therefore, a diameter sufficiently wide to keep losses from inductive and capacitive resistance minimal. The posts rest on terminals 1506; on the top end, the posts are capped by pads 1531. These pads match the locations of the fourth set terminals 1507 on the second substrate surface 1501b.

In addition, the tops of the wire spans and the wire loops have contact pads. In FIG. 15, pads 1532, contacting the wire span tops, match the locations of the fifth set terminals 1508; pads 1533, in contact with the wire loop tops, match the sixth set terminals 1509.

In FIG. 15, encapsulation compound 1520 adheres to first substrate surface 1501a and embeds the connected components 1510 and 1560. The thickness 1521 of the compound is about equal to post height 1530a. Preferably, the encapsulation material 1520 is an epoxy-based molding compound, which is processed by the transfer molding technique. The most preferable structure has an encapsulation compound thickness 1522 on top of the active surface 1560a of component 1560 about equal to the thickness 1501c of substrate 1501.

Attached to pads 1531 are reflow metal bodies 1540, preferably made of tin or a tin alloy. These reflow bodies 1540 have a first reflow temperature and interconnect a first array with other arrays. After the assembly of all arrays into the semiconductor system, reflow bodies 1550 may be attached to terminals 1507, 1508, and 1509 on the second substrate surface 1501b. The reflow temperature of bodies 1550 is lower than the reflow temperature of bodies 1540.

A cross section along cut line A-A in FIG. 15 provides a top view as illustrated in FIG. 16. The rows of posts 1530 are shown in x- and y-direction. A cross section along cut line B-B in FIG. 15 provides a bottom view as illustrated in FIG. 17. The rows of posts 1530 are shown in x- and y-direction. In addition, the two-dimensional array of metal studs 1512 on I/O ports 1511 are indicated as round entities.

Another embodiment of the invention is a method for fabricating a semiconductor system as illustrated in FIGS. 5 and 6. The method includes the steps for fabricating a first array of packaged devices exemplified in FIGS. 1 and 2, which includes the steps of:

providing a sheet-like substrate with a first and a second surface and a thickness, the substrate made of insulating material integral with conductive horizontal lines between the surfaces and conductive vertical vias extending from the first to the second surface;

forming an array of assembly sites on the first surface, each site including a first and a second set of terminals on the first surface, and a third set of terminals on the second surface;

providing semiconductor components with a thickness and I/O ports;

flip-attaching a component to each assembly site using metal studs for interconnecting the component ports to the first set terminals;

forming metal posts at least on portions of the second set terminals, the posts being about vertical to the first surface and having a height taller than the component thickness, the post locations matching at least portions of the terminals on the second surface;

embedding the connected components in encapsulation compound adhering to the first substrate surface, the compound with a thickness at least equal to the post height;

exposing the top surface of the posts;

depositing pads on each exposed post surface; and depositing reflow metal of a certain reflow temperature on the pads.

The method then continues by fabricating a second array of packaged devices using the same steps as fabricating the first array. The substrate of the second array has a third and a fourth surface; the terminals on the fourth surface match the reflow metal-covered pads of the first array; and the reflow metal has the same reflow temperature as for the first array.

In the next step, a semiconductor system is assembled by aligning and contacting the terminals on the fourth surface of the second array with the reflow metal-covered pads of the first array; and then applying thermal energy to reflow the reflow metals of both arrays to bond and electrically connect the first and the second array.

In an optional process step, the assembled arrays can be sawed vertically to singulate individual stacks of packaged devices.

Another embodiment of the invention is a method for fabricating a semiconductor system as illustrated in FIGS. 10 to 14. The method includes the steps for fabricating a first array of packaged devices exemplified in FIG. 7, which includes the steps of:

provide a sheet-like substrate with a first and a second surface and a thickness, the substrate made of insulating material integral with conductive horizontal lines between the surfaces and conductive vertical vias extending from the first to the second surface;

forming an array of assembly sites, each site including a component attach location, a first and a second set of terminals on the first surface, and a third, a fourth, and a fifth set of terminals on the second surface;

providing semiconductor components with a thickness, an active surface with a first and a second set of I/O ports, and a passive surface;

attaching the passive surface of a component to each substrate attachment location;

forming spans of bond wire to electrically connect the first set ports to the first set terminals, the top of all spans in a plane;

forming loops of bond wire on the second set ports, the top of all loops in the same plane as the span tops;

forming metal posts on the second set terminals to match the locations of the third set terminals, the posts being about vertical to the first surface and having a height to reach the plane of the wire span tops and wire loop tops;

embedding the connected components in encapsulation compound adhering to the first substrate surface, the compound with a thickness at least equal to the post height;

exposing the top surface of the posts, the wire loops, and the wire spans;

depositing a pad on the surface of each exposed top of posts, wire spans, and wire loops, the pads on the wire span tops matching the locations of the fourth set terminals, the pads on the wire loop tops matching the locations of the fifth set terminals; and depositing reflow metal of a certain reflow temperature on the pads.

The method then continues by fabricating a second array of packaged devices using the same steps as fabricating the first array. The substrate of the second array has a third and a fourth surface; the terminals on the fourth surface match the reflow-metal covered pads of the first array; and the reflow metal has the same reflow temperature as in the first array.

In the next step, a semiconductor system is assembled by aligning and contacting the terminals on the fourth surface of the second array with the reflow metal-covered pads of the first array; and then applying thermal energy to reflow the reflow metals of both arrays to bond and electrically connect the first and the second array.

In an optional process step, the assembled arrays can be sawed vertically to singulate individual stacks of packaged devices.

Another embodiment of the invention is a method for fabricating a semiconductor system, which includes the steps for fabricating a first array of packaged devices exemplified in FIG. 15:

providing a sheet-like substrate with a first and a second surface and a thickness, the substrate made of insulating material integral with conductive horizontal lines between the surfaces and conductive vertical vias extending from the first to the second surface;

forming an array of assembly sites, each site including a first, a second, and a third set of terminals on the first surface, and a fourth, a fifth, and a sixth set of terminals on the second surface;

providing first semiconductor components with a first thickness, an active surface with I/O ports, and a passive surface;

flip-attaching a first component to each assembly site using metal studs for interconnecting the ports to the first set terminals;

providing second semiconductor components with a second thickness, an active surface with a first and a second set of I/O ports, and a passive surface;

attaching the passive surface of a second component to the passive surface of each first component;

forming spans of bond wire to electrically connect the first set ports to the second set terminals, the top of all spans in a plane;

forming loops of bond wire on the second set ports, the top of all loops in the same plane as the span tops;

forming metal posts at least on portions of the second set terminals to match the locations of the fourth set terminals, the posts being about normal to the first surface and having a height to reach the plane of the wire span tops and wire loop tops;

embedding the connected components in encapsulation compound adhering to the first substrate surface, the compound with a thickness at least equal to the post height;

exposing the top surface of the posts, the wire loops, and the wire spans;

depositing a pad on the surface of each exposed top of posts, wire spans, and wire loops, the pads on the wire span tops matching the locations of the fifth set terminals, the pads on the wire loop tops matching the locations of the sixth set terminals; and depositing reflow metal of a certain reflow temperature on the pads.

The method then continues by fabricating a second array of packaged devices using the same steps as fabricating the first array. The substrate of the second array has a third and a fourth surface; the terminals on the fourth surface match the reflow-metal covered pads of the first array; and the reflow metal has the same reflow temperature as for the first array.

In the next step, a semiconductor system is assembled by aligning and contacting the terminals on the fourth surface of the second array with the reflow metal-covered pads of the first array; and then applying thermal energy to reflow the reflow metals of both arrays to bond and electrically connect the first and the second array.

In an optional process step, the assembled arrays can be sawed vertically to singulate individual stacks of packaged devices.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

We claim:

1. A method for fabricating a semiconductor system, comprising the steps of:
   fabricating a first array of packaged devices including the steps of:
      providing a sheet-like substrate having a first surface and a second surface and a thickness, the substrate made of an insulating material integral with conductive horizontal lines between the surfaces and conductive vertical vias extending from the first to the second surface;
      forming an array of assembly sites on the substrate, each site including a component attach location, a first and a second set of terminals on the first surface, and a third, a fourth, and a fifth set of terminals on the second surface;
      providing semiconductor components having a thickness, an active surface with a first and a second set of I/O ports, and a passive surface;
      attaching the passive surface of a component to each component attach location;
      forming spans of bond wire to electrically connect the first set ports to the first set terminals, the top of all spans in a plane;
      forming loops of bond wire on the second set ports, the top of all loops in the same plane as the span tops;
      forming metal posts on the second set terminals to match the locations of the third set terminals, the posts being about normal to the first surface and having a height to reach the plane of the wire span tops and wire loop tops;
      embedding the attached components in an encapsulation compound adhering to the first substrate surface, the compound having a thickness at least equal to the post height;
      exposing the top surface of the posts, the wire loops, and the wire spans;
      depositing a pad on each exposed top surface of the posts, the wire spans, and the wire loops, the pads on the wire span tops matching the locations of the fourth set terminals, the pads on the wire loop tops matching the locations of the fifth set terminals; and
      depositing a reflow metal on the pads, the metal having a reflow temperature;
   fabricating a second array of packaged devices on a second substrate by the same steps as fabricating the first array, the second substrate having a third and fourth surface, terminals on the fourth surface matching the reflow-metal covered pads of the first array, and a reflow metal of the second array having the same reflow temperature as the reflow temperature of the reflow metal in the first array; and
   assembling the semiconductor system, including the steps of:
      aligning and contacting the terminals on the fourth surface with the reflow-metal covered pads of the first array; and
      applying thermal energy to reflow the reflow metals of both arrays to bond and electrically connect the first and the second array.

2. The method according to claim 1 wherein the step of embedding the components is performed so that the encapsulation compound has a thickness over the components about equal to the sheet thickness of the substrate.

3. The method according to claim 1 further including the step of depositing reflow metal bodies on the third, fourth and fifth set terminals of the first array, the bodies having a second reflow temperature lower than the first reflow temperature.

4. The method according to claim 1 further including the steps of fabricating a third to an nth array of packaged devices, including depositing reflow metals on all pads, further the steps of assembling an array of stacked semiconductor packages steps by aligning the arrays of devices respectively, and applying thermal energy to reflow the reflow metals between all arrays in one step so that all arrays are concurrently electrically connected and a 3-dimensional system of packaged components is created.

5. The method according to claim 1 further including the step of sawing the assembled arrays vertically so that individual stacks of packaged devices are singulated.

* * * * *